(12) United States Patent
Ruan

(10) Patent No.: US 7,986,079 B2
(45) Date of Patent: Jul. 26, 2011

(54) LIGHT EMITTING DIODE LAMP

(75) Inventor: Qing-Hai Ruan, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 197 days.

(21) Appl. No.: 12/495,683

(22) Filed: Jun. 30, 2009

(65) Prior Publication Data
US 2010/0264798 A1    Oct. 21, 2010

(30) Foreign Application Priority Data

Apr. 16, 2009    (CN) .......................... 2009 1 0301596

(51) Int. Cl.
*H01J 1/02* (2006.01)

(52) U.S. Cl. ......................................... 313/46; 313/512

(58) Field of Classification Search .................... 313/46, 313/498, 506, 509, 512
See application file for complete search history.

(56) References Cited

U.S. PATENT DOCUMENTS

| 6,998,777 | B2 * | 2/2006 | Suehiro et al. | 313/512 |
| 7,535,030 | B2 * | 5/2009 | Lin | 257/99 |
| 7,875,897 | B2 * | 1/2011 | Suehiro | 257/99 |

* cited by examiner

*Primary Examiner* — Vip Patel
(74) *Attorney, Agent, or Firm* — Frank R. Niranjan

(57) ABSTRACT

A light emitting diode lamp includes a light emitting diode and a circuit board having a circuit layer and a heat conductive layer. The circuit layer includes at least one mounting area having a first electrode, a second electrode and a heat conductive section spaced from each other. A heat conductive pole is provided corresponding to the heat conductive section. Two opposite ends of the heat conductive pole are thermally attached to the light emitting diode and the heat conductive layer of the circuit board, respectively. A spacing between the heat conductive section and each of the first electrode and the second electrode ranges from 0.7 millimeter to 1.45 millimeters.

14 Claims, 2 Drawing Sheets

LIGHT EMITTING DIODE LAMP

BACKGROUND

1. Technical Field

The disclosure relates to LED (light emitting diode) lamps, and more particularly to an improved LED lamp having good heat dissipation performance.

2. Description of Related Art

A typical LED lamp includes a circuit board and a plurality of LEDs mounted on the circuit board. The circuit board includes a heat conductive layer, a heat conductive but electrically insulating layer, a bonding layer and a circuit layer, which are upwardly and successively layer-by-layer stacked. The circuit layer includes a plurality of mounting areas corresponding to the LEDs, respectively. Each mounting area includes a first electrode, a second electrode and a heat conductive section spaced from the first electrode and the second electrode. The LED is mounted on the heat conductive section of the circuit layer and electrically connected with the first electrode and the second electrode. The heat generated by the LED is transferred through the circuit layer, the bonding layer, the insulating layer and then to the heat conductive layer.

A width of the heat conductive section is a key factor influencing the heat conductive performance of the LED lamp. If the heat conductive section has a greater width, the heat conductive section will have a greater contact area with the LED thereby improving the heat conductive performance of the LED lamp. A spacing between the heat conductive section and each of the first and second electrodes of the mounting area influences the electrical performance of the LED lamp. If the spacing between the heat conductive section and each of the first and second electrodes of the mounting area is greater, a current leakage becomes smaller thereby improving the electrical performance of the LED lamp.

However, with the LED lamp becoming compact, the width of the heat conductive section and the spacing between each of the electrodes and the heat conductive section of the mounting area are mutually constrained. In other words, when the heat conductive section is provided with a greater width to improve the heat dissipating performance without increasing the mounting area of the LED lamp, the spacing between each of the electrodes and the heat conductive section will be decreased thereby influencing the electrical performance of the LED lamp. Contrarily, when the spacing between each of the electrodes and the heat conductive section of the mounting area is provided with a greater width to reduce the current leakage without increasing the mounting area of the LED lamp, the width of the heat conductive section will be decreased thereby influencing the heat conductive performance of the LED lamp, and the heat of the LED lamp cannot be adequately and timely removed.

For the foregoing reasons, therefore, there is a need in the art for an LED lamp which can overcome the limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
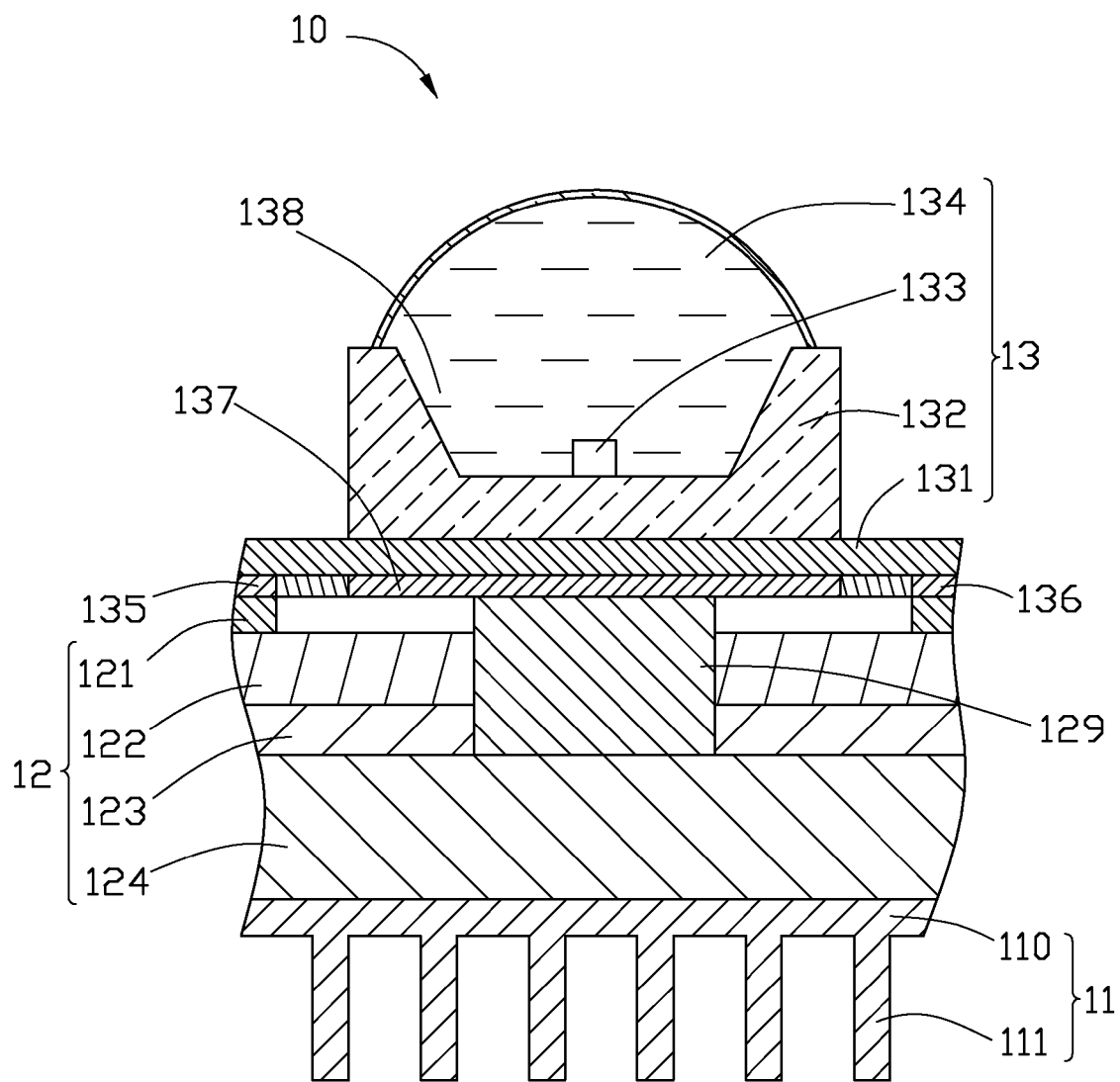
FIG. 1 is a partially cross-sectional view of an LED lamp according to an exemplary embodiment.
Figure 2:
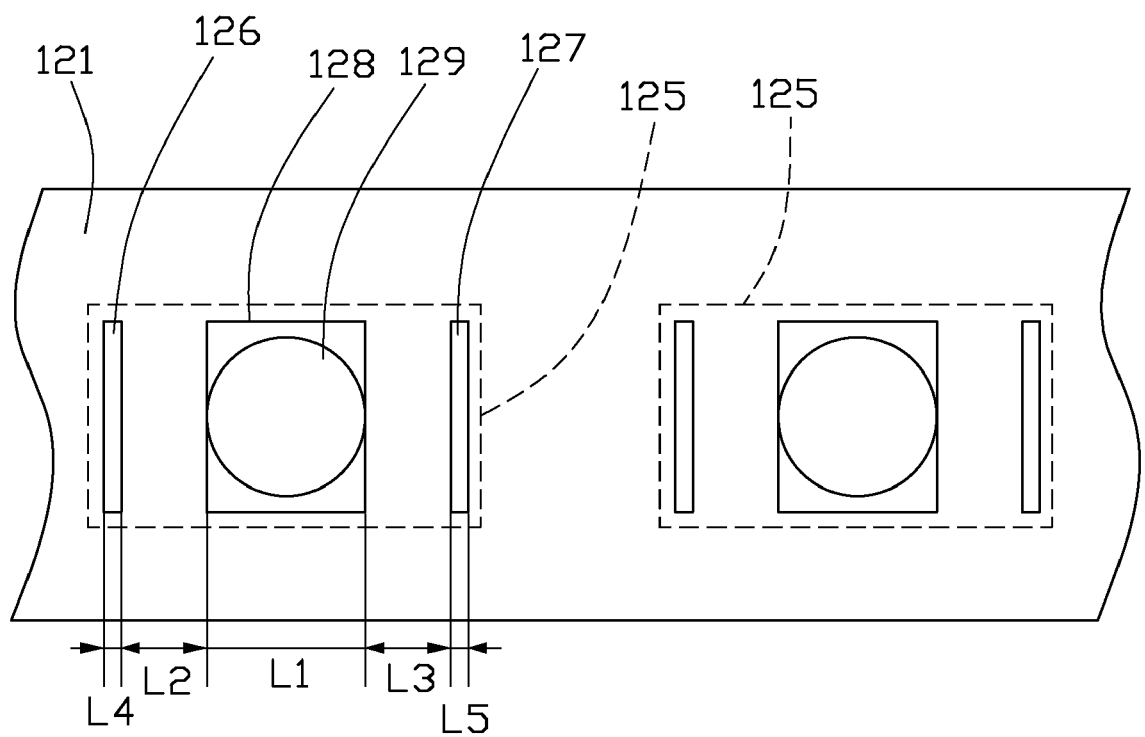
FIG. 2 is a top, plan view of a circuit board of the LED lamp of FIG. 1.

Referring to FIG. 1, a light emitting diode (LED) lamp 10 includes a heat dissipating device 11, a circuit board 12 mounted on the heat dissipating device 11 and a plurality of LEDs 13 mounted on the circuit board 12. The heat dissipating device 11 includes a metal base 110 and a plurality of fins 111 extending downwardly from the base 110.

The circuit board 12 includes a heat conductive layer 124, a heat conductive but electrically insulating layer 123, a bonding layer 122 and a circuit layer 121, which are upwardly and successively layer-by-layer stacked on the heat dissipating device 11. The circuit layer 121 and the heat conductive layer 124 are disposed at a top side and a bottom side of the circuit board 12, respectively. The bonding layer 122 and the electrically insulating layer 123 are sandwiched between the circuit layer 121 and the heat conductive layer 124. The bonding layer 122 is attached to the circuit layer 121 and the electrically insulating layer 123 is attached to the heat conductive layer 124.

The heat conductive layer 124 is mounted on the base 110 of the heat dissipating device 11 and made of a heat conductive metal material, such as aluminum. The electrically insulating layer 123 is made of ceramic and has a good heat conductive property and a good electrical insulation property. The electrically insulating layer 123 is used to perform the electrical insulation function between the circuit layer 121 and the heat conductive layer 124.

The bonding layer 122 is made of epoxy resin. The circuit layer 121 is smoothly and firmly adhered to the electrically insulating layer 123 via the bonding layer 122.

The circuit layer 121 is electrically connected with the LEDs 13. The circuit layer 121 includes a plurality of mounting areas 125 corresponding to the LEDs 13. Each mounting area 125 includes a first electrode 126, a second electrode 127 and a heat conductive section 128, which are spaced from each other. The first electrode 126 and the second electrode 127 are symmetrically disposed at left and right sides of the heat conductive section 128, respectively.

A width L1 of the heat conductive section 128 ranges from 4.1 millimeters to 5.6 millimeters. The first electrode 126 of the mounting area 125 has a same width as the second electrode 127 of the mounting area 125. A width L4 of the first electrode 126 of the mounting area 125 ranges from 0.7 millimeter to 0.95 millimeter. A width L5 of the second electrode 127 of the mounting area 125 ranges from 0.7 millimeter to 0.95 millimeter. A spacing L2 between the first electrode 126 and the heat conductive section 128 of the mounting area 125 ranges from 0.7 millimeter to 1.45 millimeters, and a spacing L3 between the second electrode 127 and the heat conductive section 128 of the mounting area 125 ranges from 0.7 millimeter to 1.45 millimeters. Preferably, the width L1 of the heat conductive section 128 ranges from 4.1 millimeters to 4.6 millimeters, the spacing L2 between the first electrode 126 and the heat conductive section 128 of the mounting area 125 ranges from 1.2 millimeters to 1.45 millimeters, and the spacing L3 between the second electrode 127 and the heat conductive section 128 of the mounting area 125 ranges from 1.2 millimeters to 1.45 millimeters.

A heat conductive pole 129 is formed corresponding to the heat conductive section 128. The heat conductive pole 129 extends vertically through the circuit layer 121, the bonding layer 122 and the electrically insulating layer 123, with a bottom end of the heat conductive pole 129 attached to a top surface of the heat conductive layer 124. The heat conductive pole 129 is cylindrical and a diameter of the heat conductive pole 129 is equal to the width L1 of the heat conductive section 128. The heat conductive pole 129 is made of a heat conductive material, such as metal or thermal grease.

Each LED 13 includes a substrate 131, a mounting base 132, an LED chip 133 and an encapsulation material 134. A bottom surface of the substrate 131 of each LED 13 is provided with a first electrode 135, a second electrode 136, and a pad 137, which are spaced from each other. The first electrode 135 and the second electrode 136 are symmetrically disposed at left and right sides of the pad 137, respectively. Preferably, a width of the pad 137 is 5.6 millimeters, and the first electrode 135 and the second electrode 136 of the LED 13 each have a width of 0.7 millimeter. A spacing between the first electrode 135 and the pad 137 of the LED 13 is 0.7 millimeter, and a spacing between the second electrode 136 and the pad 137 of the LED 13 is 0.7 millimeter. The mounting base 132 is mounted on the substrate 131 and defines a recess 138 therein. The LED chip 133 is disposed in the recess 138 of the mounting base 132 and is encapsulated by the encapsulation material 134.

Each LED 13 is located on a corresponding mounting area 125 of the circuit board 12. The first electrode 135 and the second electrode 136 of the LED 13 are attached to and electrically connect with the first electrode 126 and the second electrode 127 of the corresponding mounting area 125, respectively. The pad 137 of the LED 13 is attached to the heat conductive section 128 of the corresponding mounting area 125, and a bottom surface of the pad 137 is attached to a top end of the heat conductive pole 129.

When the LED lamp 10 is supplied with a high voltage to test the electrical performance of the LED lamp 10, the spacings L2 and L3 are more than 0.7 millimeter without increasing a size of the mounting area 125 of the LED lamp 10 thereby increasing a creepage distance and decreasing a current leakage. Thus, the LED 13 is prevented from breakdown for high reverse voltage and no electric spark is generated. At the same time, since the pad 137 of each LED 13 and the heat conductive layer 124 of the circuit board 12 are thermally connected with the top end and the bottom end of the heat conductive pole 129, respectively, each LED 13 is in thermal connection with the heat conductive layer 124 of the circuit board 12 by the heat conductive pole 129. In operation of the LED lamp 10, the heat generated by the LED 13 is directly transferred from the pad 137 of the LED 13 to the heat conductive layer 124 by the heat conductive pole 129, and then the heat is dissipated by the heat dissipating device 11, to thereby improve the heat dissipation of the LED lamp 10 and prolong a lifespan of the LED lamp 10. Therefore, the LED lamp 10 has a good thermal performance and a good electrical performance.

It will be obvious that, within the scope of the invention, many variations are possible to those skilled in the art. The scope of protection of the invention is not limited to the example given herein.

What is claimed is:

1. A light emitting diode lamp comprising:
a circuit board comprising a circuit layer, a bonding layer and a heat conductive layer, the bonding layer being sandwiched between the circuit layer and the heat conductive layer, the circuit layer comprising at least one mounting area, the at least one mounting area comprising a first electrode, a second electrode and a heat conductive section spaced from each other, the first electrode and the second electrode being disposed at two opposite sides of the heat conductive section, a spacing between the heat conductive section and each of the first electrode and the second electrode ranging from 0.7 millimeter to 1.45 millimeters;
at least one light emitting diode mounted on the at least one mounting area of the circuit layer of the circuit board; and
a heat conductive pole being provided corresponding to the heat conductive section of the at least one mounting area, the heat conductive pole extending through the circuit layer and the bonding layer, two opposite ends of the heat conductive pole being thermally attached to the at least one light emitting diode and the heat conductive layer of the circuit board, respectively, whereby heat generated by the at least one light emitting diode is transmitted to the heat conductive layer via the heat conductive pole.

2. The light emitting diode lamp as claimed in claim 1, wherein a width of the heat conductive section is equal to a diameter of the heat conductive pole.

3. The light emitting diode lamp as claimed in claim 1, wherein a width of the heat conductive section ranges from 4.1 millimeters to 5.6 millimeters.

4. The light emitting diode lamp as claimed in claim 3, wherein the width of the heat conductive section ranges from 4.1 millimeters to 4.6 millimeters.

5. The light emitting diode lamp as claimed in claim 1, wherein a width of each of the first and the second electrodes of the at least one mounting area ranges from 0.7 millimeter to 0.95 millimeter.

6. The light emitting diode lamp as claimed in claim 1, wherein the first electrode and the second electrode of the at least one mounting area are symmetrically disposed at the two opposite sides of the heat conductive section.

7. The light emitting diode lamp as claimed in claim 1, wherein the at least one light emitting diode comprises a substrate, a mounting base on the substrate, a light emitting diode chip and an encapsulation material, the mounting base defining a recess therein, the light emitting diode chip being disposed in the recess, the encapsulation material encapsulating the light emitting diode chip in the recess.

8. The light emitting diode lamp as claimed in claim 7, wherein a bottom surface of the substrate of the at least one light emitting diode is provided with a first electrode, a second electrode and a pad between the first and the second electrodes, the first and the second electrodes of the substrate being electrically connected with the first and the second electrodes of the at least one mounting area, respectively, the pad being attached to the heat conductive pole.

9. The light emitting diode lamp as claimed in claim 1 further comprising a heat dissipating device, the heat conductive layer of the circuit board being in thermal connection with the heat dissipating device.

10. The light emitting diode lamp as claimed in claim 9, wherein the heat dissipating device comprises a base and a plurality of fins extending from the base, the base of the heat dissipating device being mounted on the heat conductive layer of the circuit board.

11. The light emitting diode lamp as claimed in claim 1, wherein the heat conductive pole is made of thermal grease.

12. The light emitting diode lamp as claimed in claim 1, wherein the heat conductive pole is made of a metal.

13. The light emitting diode lamp as claimed in claim 1, wherein the circuit board further comprises a heat conductive but electrically insulating layer, the insulating layer being sandwiched between the bonding layer and the heat conductive layer, the heat conductive pole extending through the insulating layer.

14. The light emitting diode lamp as claimed in claim 1, wherein the spacing between the heat conductive section and each of the first electrode and the second electrode of the at least one mounting area ranges from 1.2 millimeters to 1.45 millimeters.

* * * * *